United States Patent [19]

Aono et al.

[11] Patent Number: 4,858,197

[45] Date of Patent: Aug. 15, 1989

[54] OUTPUT BUFFER CONTROL CIRCUIT OF MEMORY DEVICE

[75] Inventors: Akira Aono; Mitsuo Isobe, both of Yokohama, Japan

[73] Assignee: Kabushiki Kaisha Toshiba, Kawasaki, Japan

[21] Appl. No.: 198,052

[22] Filed: May 24, 1988

[30] Foreign Application Priority Data

May 26, 1987 [JP] Japan .................................. 62-128811
May 26, 1987 [JP] Japan .................................. 62-128817

[51] Int. Cl.$^4$ .............................................. G11C 8/00
[52] U.S. Cl. .................... 365/233.5; 365/190
[58] Field of Search ............... 365/230, 233, 203, 189, 365/190, 203

[56] References Cited

U.S. PATENT DOCUMENTS

| | | | |
|---|---|---|---|
| 4,573,147 | 2/1986 | Aoyama et al. .................... | 365/230 |
| 4,616,342 | 10/1986 | Miyamoto .......................... | 365/190 |
| 4,744,063 | 5/1988 | Ohtani et al. ...................... | 365/233 |

OTHER PUBLICATIONS

T. Wada et al., "A 34ns 1Mb CMOS SRAM Using Triple Poly," IEEE International Solid-State Circuits Conference, Digest of Technical Papers, Session 19.7, pp. 262-263, Feb., 1987.
M. Isobe et al., "A 46ns 256K CMOS RAM," IEEE International Solid-State Circuits Conference, pp. 214-215, Feb., 1984.

*Primary Examiner*—Joseph A. Popek
*Attorney, Agent, or Firm*—Finnegan, Henderson, Farabow, Garrett & Dunner

[57] ABSTRACT

In an output buffer control circuit of a memory, the set/reset state of a flip-flop is controlled by an address transition detection output and a read detection output supplied when completion of data read from a memory cell is detected, and the active/inactive state of an output buffer for outputting the readout data from the memory cell is controlled by an output from the flip-flop. According to this arrangement, when an address input transits and the address transition detection output is enabled, the output buffer is inactivated. When data is read out from the memory cell and the read detection output is enabled after the address input transits, the output buffer can be activated.

18 Claims, 10 Drawing Sheets

OUTPUT BUFFER CONTROL CIRCUIT OF MEMORY DEVICE

BACKGROUND OF THE INVENTION

1. Field of the Invention

The present invention relates to an improvement of an output buffer of a semiconductor memory and, more particularly, to an output buffer control circuit for controlling a data output timing of the output buffer when data is to be read out from a memory which starts an access operation in response to an address transition detection signal or a chip enable signal.

2. Description of the Related Art

Figure 1:
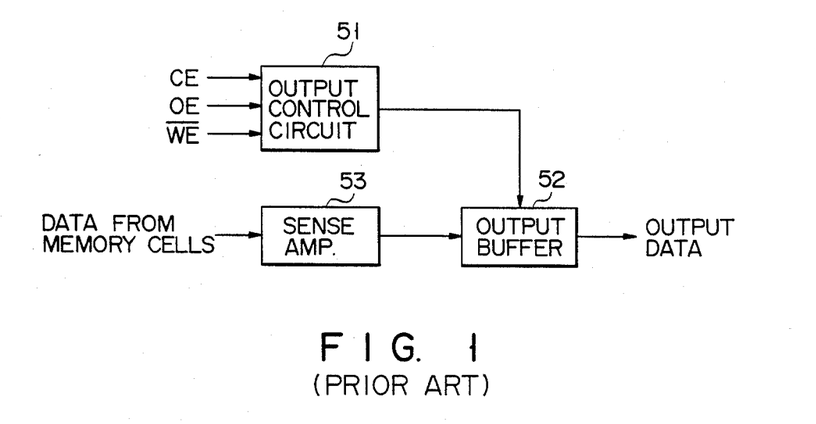
FIG. 1 is a block diagram showing a conventional SRAM output buffer control circuit to be operated in response to an address transition.

FIG. 1 shows the arrangement of an output buffer control circuit as used in a conventional address access type semiconductor memory such as a CMOS type SRAM (static random access memory), the purpose of the control circuit being to initiate a memory access operation in response to a detection output (ATD signal) from an address transition detector for detecting a transition of an address input. More specifically, a chip enable (CE) signal for controlling the enable/disable state of the memory, an output enable (OE) signal for controlling a data output operation, and a write enable ($\overline{WE}$) signal for controlling writing of data in memory cells are input to output control circuit 51, and logical processing is performed. Then, the active/inactive state of output buffer (3-state buffer) 52 is controlled using the resultant logical processing output (output buffer control signal). Note that reference numeral 53 denotes a sense amplifier for detecting/amplifying data from the memory cells and outputting the resultant data to output buffer 52.

Figures 2A, 2B:
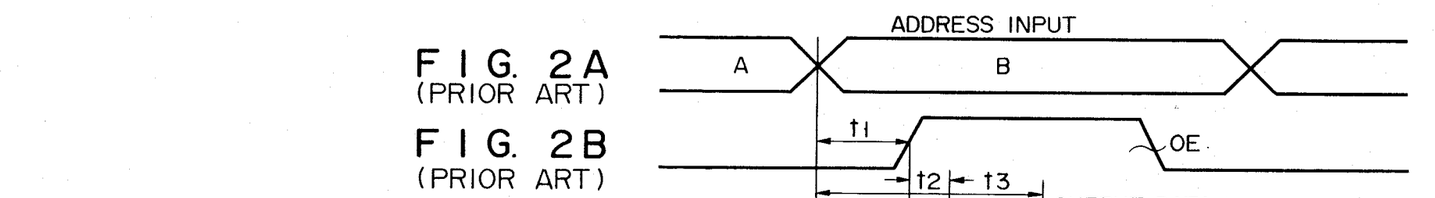
FIGS. 2A to 2C are timing charts for explaining an operation of the circuit in FIG. 1.
Figure 2C:
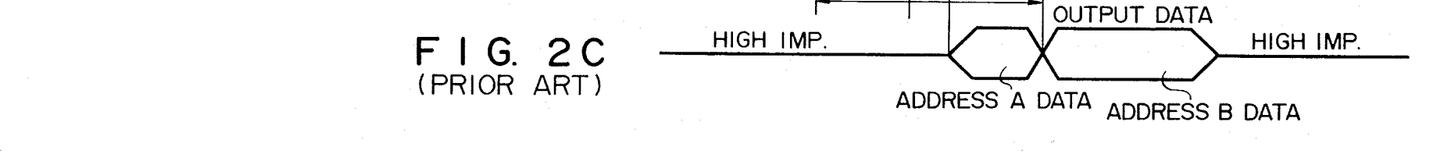

FIGS. 2A to 2C show the timing of an address access operation in the above-described memory, wherein the OE signal is rendered active (H level) after an address input transits from A to B while the CE signal is in the enable state (i.e., CE=H level). That is, the OE signal is rendered active after time t1 from when the address transits from A to B, and then output buffer 52 is rendered active after time t2.

Output buffer 52 is in the high impedance state (output open) until it is rendered active. However, if the sum of times t1 and t2 is smaller than a memory access time (a period of time from an address transition until data output from a selected memory cell), output buffer 52 outputs data of a memory cell corresponding to current address B after it outputs data of a memory cell corresponding to preceding address A.

In this case, however, if data from the memory cells respectively corresponding to addresses A and B are different from each other (e.g., memory cell data corresponding to addresses A and B are "0" and "1", respectively), output buffer 52 outputs "0" in the high impedance state, and then outputs the inverted value "1". For this reason, a rapidly changing large current passes through output buffer 52, producing strong noise (output noise and power source noise) in the output signal lines or power source lines (including ground lines) of the memory. In particular when the sum of times t1 and t2 in FIGS. 2A to 2C is close to time t3, data A is output, immediately after which inverted data B is output, producing even greater noise as a result. This noise, is likely to adversely affect for example, the operation of determining the logical level of various input signals to the memory, or the operation of the memory itself or that of a circuit of the back stage commonly connected to a power source with the memory.

Figure 3:
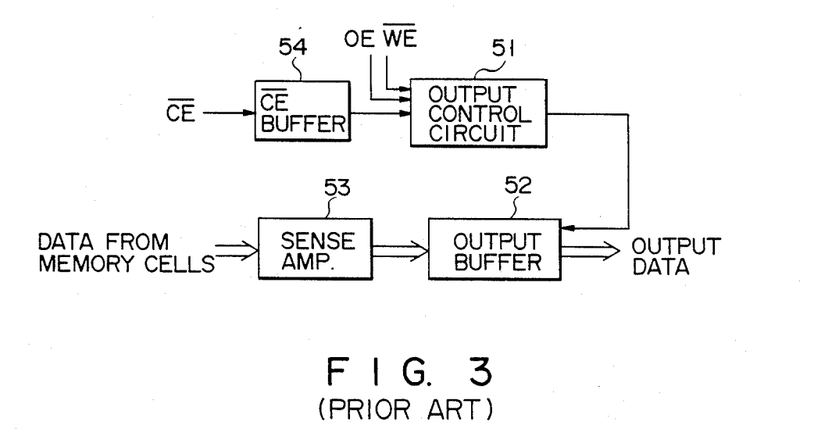
FIG. 3 is a block diagram showing a conventional SRAM output buffer control circuit to be operated in response to a chip enable signal of a memory chip.

FIG. 3 shows the arrangement of an output buffer control circuit as used in a conventional $\overline{CE}$ access operation type semiconductor memory, this control circuit initiating a memory access operation in response to a $\overline{CE}$ (chip enable) signal for controlling the enable/disable state of the memory. Referring to FIG. 3, reference numeral 54 denotes a $\overline{CE}$ buffer; 51, an output control circuit for logically processing an output signal from $\overline{CE}$ buffer 54, the OE signal, and the $\overline{WE}$ signal, and outputting an output buffer control signal; and 53, a sense amplifier for detecting/amplifying data from memory cells and outputting the resultant data to output buffer 52.

Figures 4A, 4B:
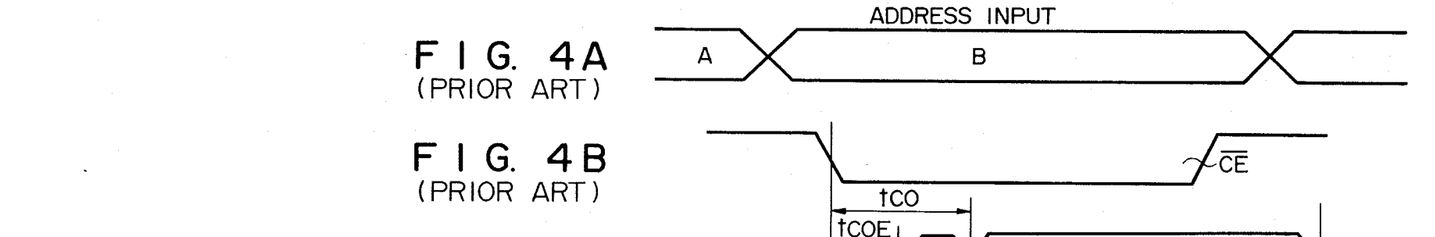
FIGS. 4A to 4C are timing charts for explaining an operation of the circuit in FIG. 3.
Figure 4C:
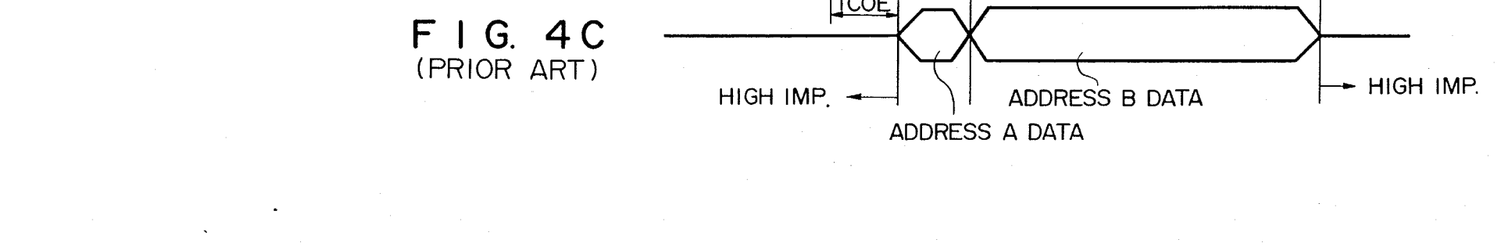

FIGS. 4A to 4C show the timing of a $\overline{CE}$ access operation in the above-described memory, wherein an address input transits from A to B, and then the memory is enabled by the $\overline{CE}$ signal. When the $\overline{CE}$ signal is enabled (L level), output buffer 52 is rendered active. Then, output data is set in the low impedance state from the high impedance state, and data of a memory cell corresponding to address B is output after access time $t_{CO}$.

However, if the OE signal is rendered active (H level) immediately after the $\overline{CE}$ signal is enabled (L level), or if the OE signal stays at an active state, data of a memory cell corresponding to immediately preceding address A may be output after time $t_{COE}$ shorter than access time $t_{CO}$. In this case, if data of the memory cells respectively corresponding to addresses A and B are different, output buffer 52 outputs "0" level or "L" level in the high impedance state, and then outputs the inverted value, i.e., "1" level or "H" level. For this reason, a current flowing through output buffer 52 is greatly increased, resulting in strong noise (output noise and power source noise) being produced in the output signal lines or power source lines (including ground lines) of the memory. In particular, when time $t_{COE}$ approaches time $t_{CO}$, data A is output, immediately after which inverted data B is output, resulting in even greater noise being produced. Being similar to the noise produced in the circuit of FIG. 1, this noise also adversely affects the operation of determining the logical level of various input signals to the memory, and thus the operation of the memory itself or that of a circuit of the back stage commonly connected to a power source with the memory.

It should be noted that the following reference serves as an example of a conventional technique wherein the above-described problems arise, its contents being incorporated in the description of present invention.

244 1984 IEEE International Solid-State Circuit Conference

ISS C84/Feb. 23, 1984

SESSION XV: STATIC RAMs

THPM 15.1:

A 46 ns 256K CMOS RAM

Mitsuo Isobe, Junichi Matsunaga, Takayasu Sakurai, Takayuki Ohtani, Kazuhiko Sawada, Hiroshi Nozawa, Tetsuya Iizuka, Susumu Kohyama, Toshiba Semiconductor Device Engineering Laboratory Kawasaki, Japan

SUMMARY OF THE INVENTION

It is an object of the present invention to provide an output buffer control circuit of a memory, which can solve the problem wherein if the level of output data is rapidly inverted until when desired data is output upon an address transition or after the memory chip is enabled, large output and power source noise is caused. The present invention is characterized in that the set/reset state of a flip-flop is controlled by an address transition detection output and a read detection output supplied when completion of data read from a memory cell is detected, and the active/inactive state of an output buffer for outputting the readout data from the memory cell is controlled by an output from the flip-flop.

According to the above-described arrangement, when an address input transits and the address transition detection output is enabled, the output buffer is inactivated. When data is read out from the memory cell and the read detection output is enabled after the address input transits, the output buffer can be activated. Therefore, even if an output enable signal is supplied when the read detection output is not enabled immediately after an address input transition, the output buffer is in the high impedance state. Thus, the output buffer is activated in synchronism with the timing when data is output from a desired memory cell upon an address transition, thereby outputting the data. With this operation, old (erroneous) data corresponding to the preceding address is not output immediately before the desired data is output, thereby minimizing the output and power source noise during a data output operation.

The present invention is also characterized in that the set/reset state of a flip-flop is controlled by the $\overline{CE}$ signal for controlling the enable/disable state of a memory and a read detection output supplied when completion of data read from a memory cell is detected, and the active/inactive state of an output buffer for outputting the readout data from the memory cell is controlled by an output from the flip-flop.

When the $\overline{CE}$ signal is disabled, the output buffer when the $\overline{CE}$ signal is enabled and then data is read out from a memory cell, the output buffer can be activated. Therefore, the output buffer can be activated in synchronism with the timing when new memory cell data is output after the $\overline{CE}$ signal is enabled. As a result, old (erroneous) data is not output immediately before this new data is output, thereby minimizing output and power source noise during a data output operation.

DETAILED DESCRIPTION OF THE PREFERRED EMBODIMENTS

An embodiment of the present invention will be described in detail below with reference to the accompanying drawings.

Figure 5:
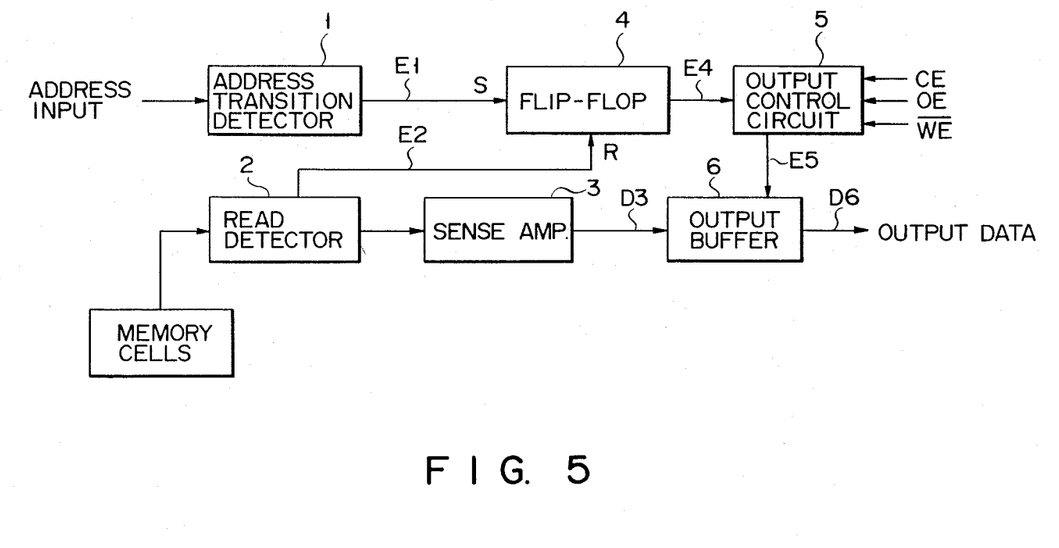
FIG. 5 is a block diagram showing an output buffer control circuit to be operated in response to an address transition according to an embodiment of the present invention.

FIG. 5 shows part of an SRAM which starts an access operation in response to an address transition. Referring to FIG. 5, reference numeral 1 denotes an address transition detector for detecting an address input transition; 2, a read detector for detecting a completion point of data read from a memory cell; 3, a sense amplifier for detecting/amplifying the readout data from the memory cell; 4, a flip-flop to which outputs E1 and E2 from address transition detector 1 and read detector 2 are respectively supplied as set and reset inputs; 5, an output control circuit for logically processing output E4 from flip-flop 4, chip enable signal $\overline{CE}$, output enable signal $\overline{OE}$, and write enable signal $\overline{WE}$, and generating output control signal E5; and 6, an output buffer whose active/inactive state is controlled by output signal E5 from output control circuit 5 and which buffer-amplifies output D3 from sense amplifier 3 and outputs the amplified value when it is in the active state.

Flip-flop 4 is set when an address input transits and address transition detection output E1 is rendered active (H level). Output buffer 6 is controlled to be set in the inactive state in response to a set output (E4="L") at this time. Flip-flop 4 is reset by detection output E2 supplied when readout data from the memory cell is detected after the address input transits. Output buffer 6 is controlled to be set in the active state in response to a reset output (E4="H") at this time.

Figure 6:
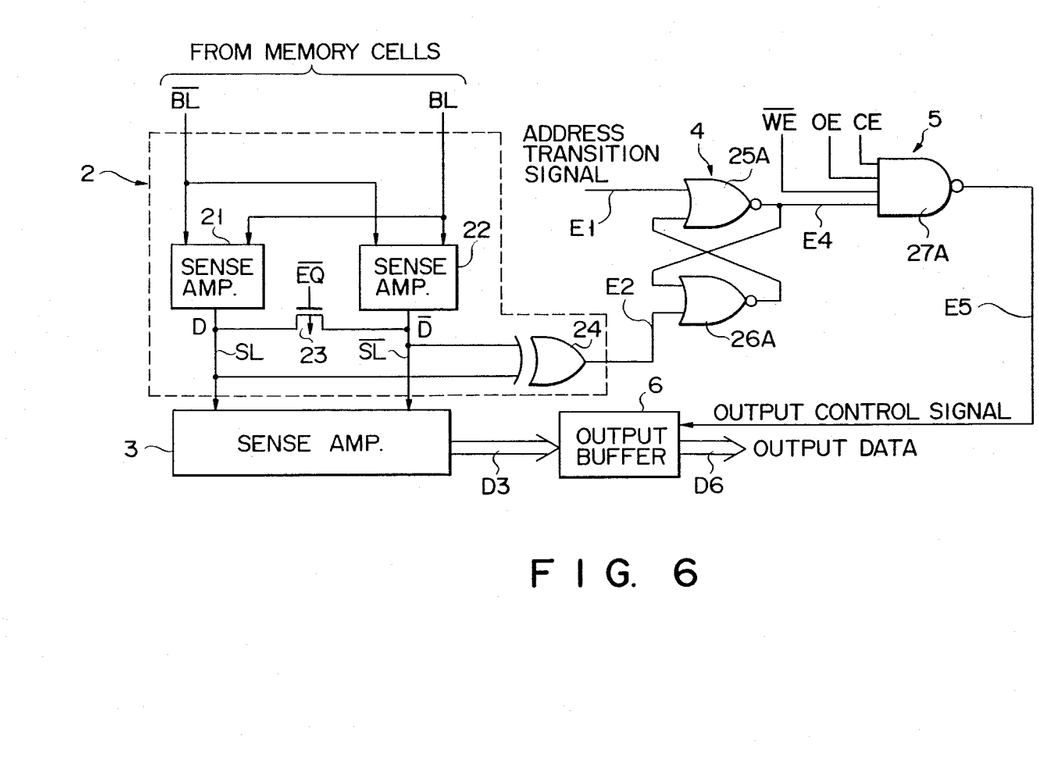
FIG. 6 is a circuit diagram showing internal arrangements of circuit blocks 2, 4, and 5 in FIG. 5.

FIG. 6 shows a detailed arrangement of each of read detector 2, flip-flop 4, and output control circuit 5. More specifically, read detector 2 comprises two sense amplifiers 21 and 22 for detecting a potential difference between bit line pair of BL and $\overline{BL}$ in a memory cell array, P channel MOS (insulated gate) type transistor 23, connected between a pair of sense lines SL and $\overline{SL}$ connected to output terminals D and $\overline{D}$ of opposite phases of two sense amplifiers 21 and 22, for equalizing the sense lines, and EXOR gate 24 having two input terminals to which the pair of sense lines SL and $\overline{SL}$ are connected. Note that sense amplifier 3 in FIG. 5 connected to the pair of sense lines SL an $\overline{SL}$. In addition, the output terminal of each of two 2-input NOR gates 25A and 26A of flip-flop 4 is connected to a corresponding one of the input terminals of the other NOR gate (i.e., these NOR gates are cross-coupled). Output control circuit 5 is constituted by 4-input NAND gate 27A.

Figure 7A:
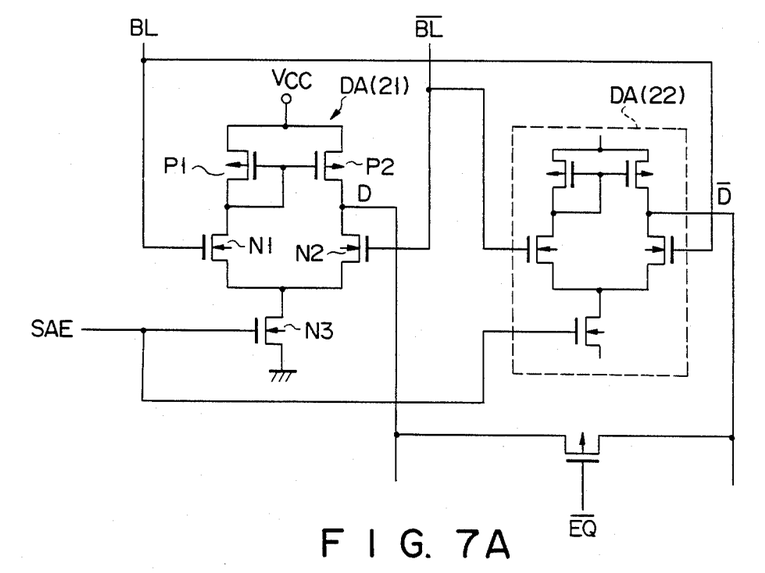
FIG. 7A is a circuit diagram showing detailed arrangements of sense amplifiers 21 and 22 in FIG. 6.

Each of sense amplifiers 21 and 22 is constituted by, current mirror type CMOS differential amplifier DA whose active/inactive state is controlled by a sense amplifier enable (SAE) signal. This differential amplifier DA comprises differential amplifier N channel transistors N1 and N2 having the gates to which bit lines BL and $\overline{BL}$ are respectively connected, load P channel transistors P1 and P2 connected to the current mirror, and switching N channel transistor N3 having the gate to which the SAE signal is supplied.

Figure 7B:
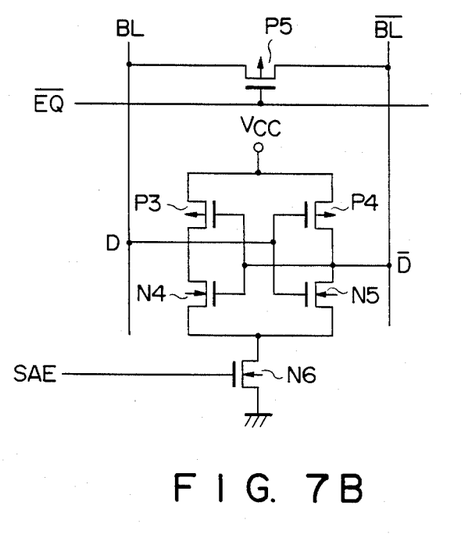
FIG. 7B shows a circuit (latch circuit) which can be used in place of sense amplifiers 21 and 22 in FIG. 7A.

In place of the pair of sense amplifiers 21 and 22, a single CMOS latch circuit whose active/inactive state is controlled by the SAE signal may be used, as shown in FIG. 7B. In this case, reference symbols N4, N5, and N6 denote N channel transistors; and P3, P4, and P5 denote P channel transistors, respectively.

An operation of the circuit in FIGS. 5 and 6 will be described with reference to the timing charts in FIGS. 8A to 8M.

When an address input (FIG. 8A) transits from A to B while the CE signal is in the enabled state (H level in FIG. 8D), address transition detector 1 generates H-level (active) address transition detection output E1 (FIG. 8E). As a result, flip-flop 4 is set. At this time, output E5 (FIG. 8J) from output control circuit 5 is set at H level by set output E4 (transition of H to L In FIG. 8I) regardless of the levels of DE, $\overline{WE}$, and CE. Then, output buffer 6 is set in the inactive state (an output is set in the high impedance state, as shown in FIG. 8M), and a memory access operation is started by address transition detection output E1.

At this time, equalizing transistor 23 is kept turned on for a predetermined period of time by the sense line equalizing signal $\overline{EQ}$ (FIG. 8F) generated by a one-shot or the like to be triggered by address transition detection output E1, thereby equalizing the potentials data D and $\overline{D}$) at sense lines SL and $\overline{SL}$. As a result, output E2 (FIG. 8H) from EXOR gate 24 is forcibly set at L level.

When a potential difference is generated between bit linepair of BL and $\overline{BL}$ in accordance with information of a memory cell corresponding to address B, sense amplifying is performed by sense amplifiers 21 and 22. In this case, changing directions of outputs D and $\overline{D}$ from sense amplifiers 21 and 22 are opposite to each other, and hence data D and $\overline{D}$ (FIG. 8G) having levels complementary to each other appear on sense lines SL and $\overline{SL}$. As a result, output E2 from EXOR gate 24 is set at H level, and flip-flop 4 is reset.

At this time, reset output E4 (FIG. 8I) from flip-flop 4 is set at H level. Therefore, if the OE signal (FIG. 8B) and the $\overline{WE}$ signal (FIG. 8C) are set at H level, since the CE signal (FIG. 8D) is already set at H level, output E5 (FIG. 8J) from output control circuit 5 is set at L level and output buffer 6 is set in the active state.

That is, output buffer 6 is activated and outputs data D6 (FIG. 8M) in synchronism with the timing when data D3 (FIG. 8L) is read out from a memory cell corresponding to input address B after time t3 (access time) from an address input transition.

Assume that the OE signal is rendered active (L→H) immediately after an address transits (A→B) as shown in FIGS. 8A and 8B. In this case, since flip-flop 4 has been set by address transition detection output E1 generated upon the address transition (A→B), output buffer 6 is not activated even if the OE signal is input. For this reason, output D6 is kept in the high impedance state until data from a memory cell is detected by sense amplifiers 21 and 22.

As described above, according to the embodiment of FIG. 5, when an access operation is started in response to an address transition, the output buffer is kept in the high impedance state until data is output from a memory cell corresponding to a desired address (B). Accordingly, data is not output from a memory cell corresponding to the preceding address (A) before the data at the desired address (B) is output. As a result, noise caused in output signal lines or power source lines during a data read operation can be minimized.

Therefore, the embodiment can be effectively applied to an address access operation type memory (SRAM, DRAM, or ROM).

A second embodiment of the present invention will be described in detail below with reference to the accompanying drawings.

Figure 9:
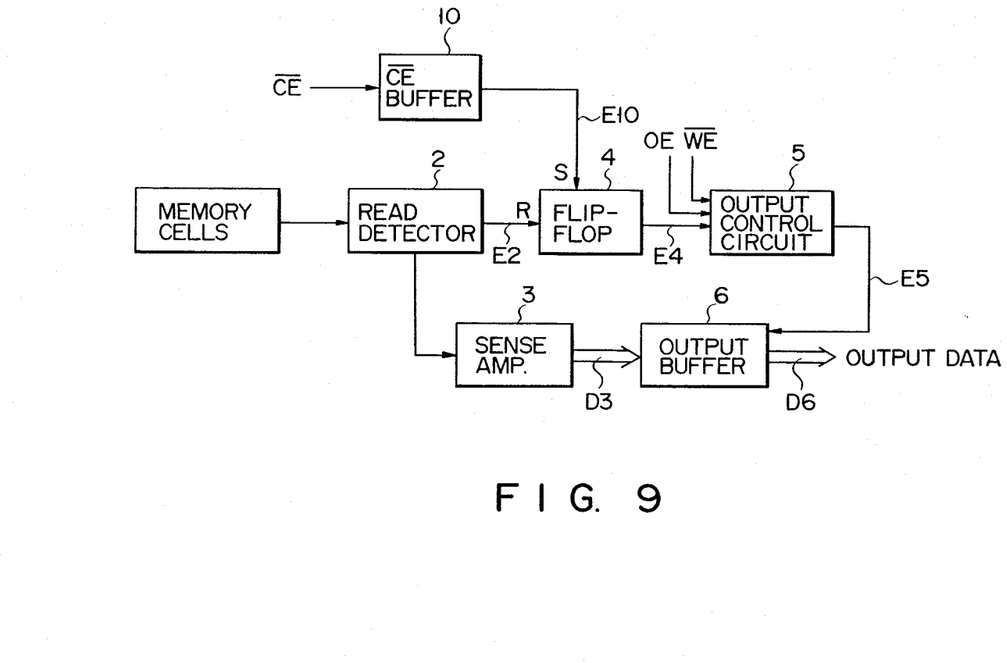
FIG. 9 is a block diagram showing an output buffer control circuit to be operated in response to a chip enable signal of a memory chip according to another embodiment of the present invention.

FIG. 9 shows part of an SRAW which starts an access operation in response to chip enable signal $\overline{CE}$. Referring to FIG. 9, reference numeral 10 denotes a $\overline{CE}$ buffer to which the $\overline{CE}$ signal is input; 2, a read detector for detecting a completion point of data read from a memory cell; 3, a sense amplifier for detecting and amplifying the readout data from the memory cell; 4, a flip-flop to which outputs E10 and E2 are supplied from $\overline{CE}$ buffer 10 and read detector 2 as set and reset inputs, respectively; 5, an output control circuit for logically processing output E4 from flip-flop 4, output enable signal OE, and write enable signal $\overline{WE}$, and generating an output control signal; and 6, an output buffer whose active/inactive state is controlled by output control signal E5 from output control circuit 5 and which buffer-amplifies output data D3 from sense amplifier 3 and outputs the amplified output.

Flip-flop 4 is set when the $\overline{CE}$ signal input is disabled. Output buffer 6 is controlled to be inactivated by set output E4=L at this time. Flip-flop 4 is reset by detection output E2 supplied when readout data from a memory cell is detected after the $\overline{CE}$ signal is enabled. Output buffer 6 is controlled to be activated by reset output E4=H at this time.

Figure 10:
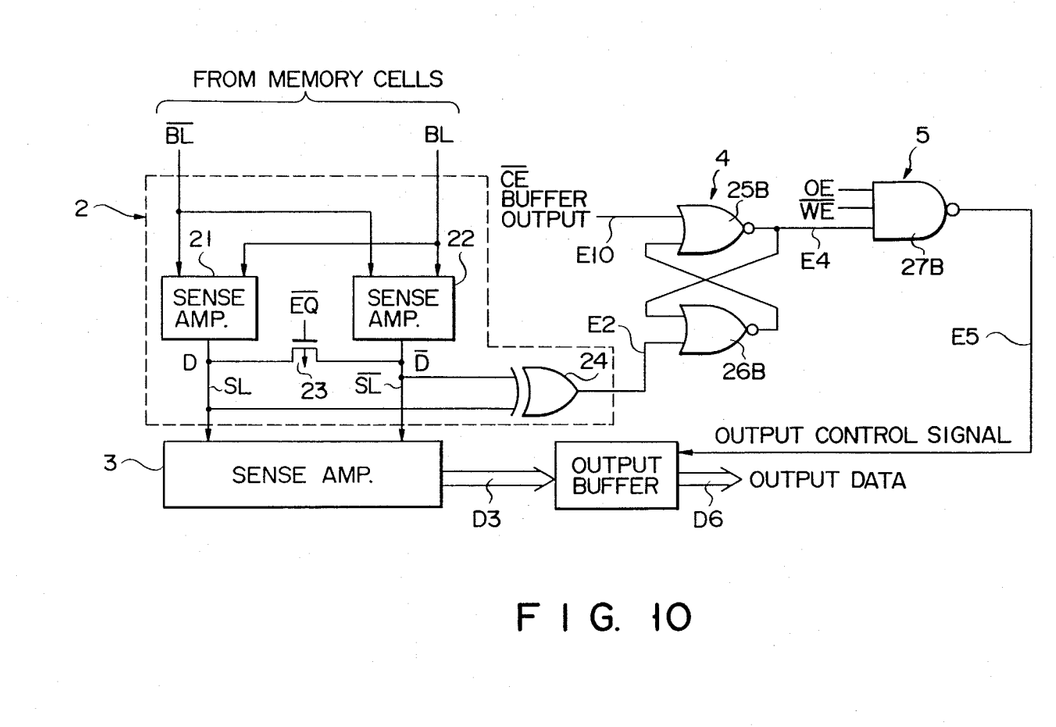
FIG. 10 is a circuit diagram showing internal arrangements of circuit blocks 2, 4, and 5 in FIG. 9.

FIG. 10 shows a detailed arrangement of each of read detector 2, flip-flop 4, and output control circuit 5. More specifically, read detector 2 comprises two sense amplifiers 21 and 22 for detecting and amplifying the potential difference between bit line pair of BL and $\overline{BL}$ In a memory cell array, sense line equalizing MOS type P channel transistor 23 connected between a pair of sense lines SL and $\overline{SL}$ respectively connected to output terminals of opposite phases of two sense amplifiers 21 and 22, and EXOR gate 24 having two input terminals to which the pair of sense lines SL and $\overline{SL}$ are connected.

Note that sense amplifier 3 shown in FIG. 9 is connected to the pair of sense lines SL and $\overline{SL}$. In addition, flip-flop 4 is constituted by two cross-coupled 2-input NOR gates 25B and 26B, whereas output control circuit 5 is constituted by 3-input NAND gate 27B. In place of sense amplifiers 21 and 22, the circuits shown in FIGS. 7A and 7B, for example, may be used.

A circuit operation in FIGS. 9 and 10 will be described with reference to the timing charts in FIGS. 11A to 11M.

When the $\overline{CE}$ signal input (FIG. 11D) is disabled (H level), flip-flop 4 is set to output set output E4=L (FIG. 11I), which causes output E5 (FIG. 11J) from output control circuit 5 to be set at H level. As a result, output buffer 6 is set in the inactive state (output D6 is set in the high impedance state, as shown in FIG. 11M).

When the $\overline{CE}$ signal input (FIG. 11D) is enabled (L level) after the address input (FIG. 11A) transits from A to B, a memory access operation is started. At this time, equalizing transistor 23 is turned on for a predetermined period of time by sense line equalizing signal $\overline{EQ}$ (FIG. 11F) generated by a one-shot or the like to be triggered by the CE signal input, so that the potentials (data D and $\overline{D}$) at sense lines SL and $\overline{SL}$ are equalized. As a result, output E2 (FIG. 11H) from EXOR gate 24 becomes L level.

Subsequently, when a potential difference between bit line pair of BL and $\overline{BL}$ appears in accordance with information of a memory cell corresponding to address B, sense amplifying is performed by sense amplifiers 21 and 22. In this case, since the changing directions of outputs D and $\overline{D}$ from sense amplifiers 21 and 22 are opposite to each other, data D and $\overline{D}$ (FIG. 11G) complementary to each other appear on sense lines SL and $\overline{SL}$. As a result, output E2 (FIG. 11H) from EXOR 24 is set at H level, and flip-flop 4 is reset.

At this time, reset output E4 (FIG. 11I) from flip-flop 4 is set at H level. If the OE signal input (FIG. 11B) and the $\overline{WE}$ signal input (FIG. 11C) are set at H level, output E5 (FIG. 11J) from output control circuit 5 is set at L level, thereby activating output buffer 6. That is, output buffer 6 is activated so as to output data D6 (FIG. 11M) in synchronism with the timing when data D3 (FIG. 11L) is read out from a memory cell corresponding to input address B after the $\overline{CE}$ signal input (FIG. 11D) is enabled (H→L).

According to the embodiment in FIG. 9 described above, when an access operation is started in response to a chip enable signal, the output buffer is kept in the high impedance state until data is output from a memory cell corresponding to a desired address (B). With this arrangement, data is not output from a memory cell corresponding to the preceding address (A) immediately before the data at the desired address (B) is output, thereby minimizing noise caused in output signal lines or power source lines during a data read operation.

Therefore, the embodiment can be applied to $\overline{CE}$ access operation type semiconductor memory (SRAM, DRAM, or ROM), and can be also applied to a memory without an address transition detector.

Figure 12:
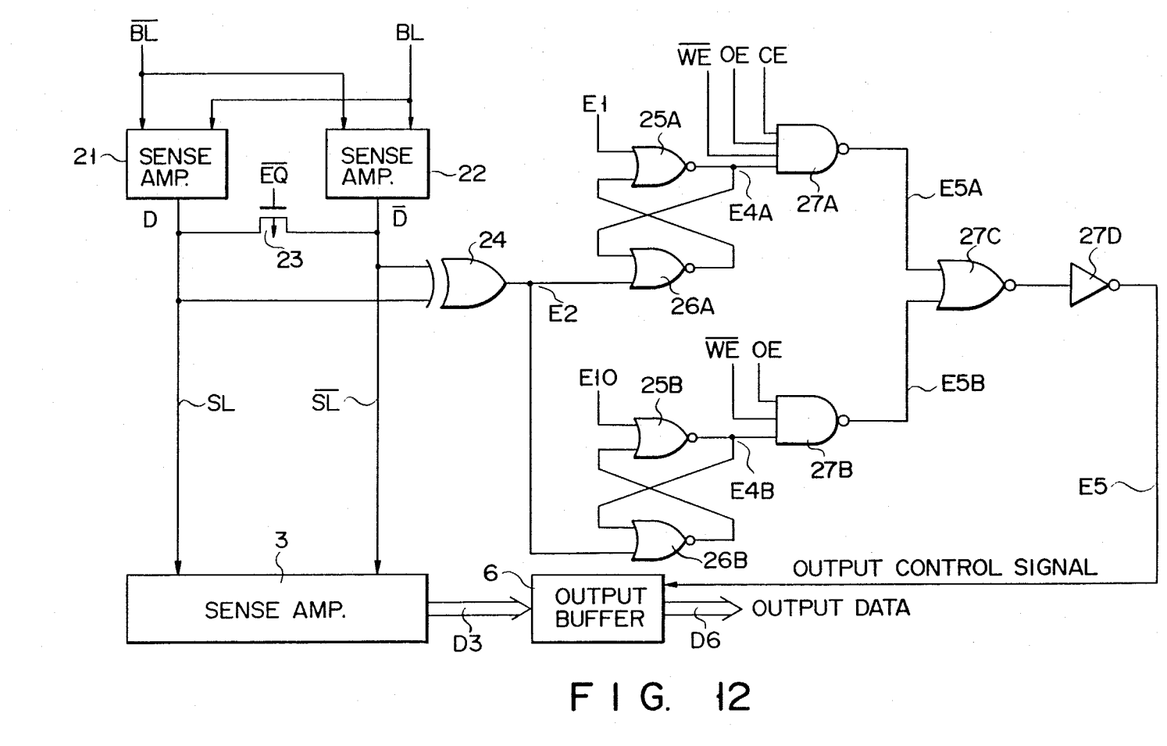
FIG. 12 is a block diagram showing an output buffer control circuit to be operated in response to both an address transition and a chip enable signal of a memory chip according to still another embodiment of the present invention.

FIG. 12 is a block diagram showing an output buffer control circuit to be operated in response to address transition signal E1 and chip enable signal CE (E10) according to still another embodiment of the present invention.

In the embodiment in FIG. 12, the first flip-flop (25A, 26A) as in FIG. 6 is provided for an address transition detection output, and the second flip-flop (25B, 26B) as in FIG. 10 is provided for a chip enable signal.

Output E4A from the first flip-flop (25A, 26A) is input to 4-input NAND gate 27A receiving signals CE, OE, and $\overline{WE}$, whereas output E4B from the second flip-flop (25B, 26B) is input to 3-input NAND gate 27B receiving signals OE and WE.

Outputs E5A and E5B respectively supplied from NAND gates 27A and 27B are converted into output control signal E5 through NOR gate 27C and inverter 27D. An output state of output buffer (3-state buffer) 6 is controlled by this signal E5.

Figure 8:
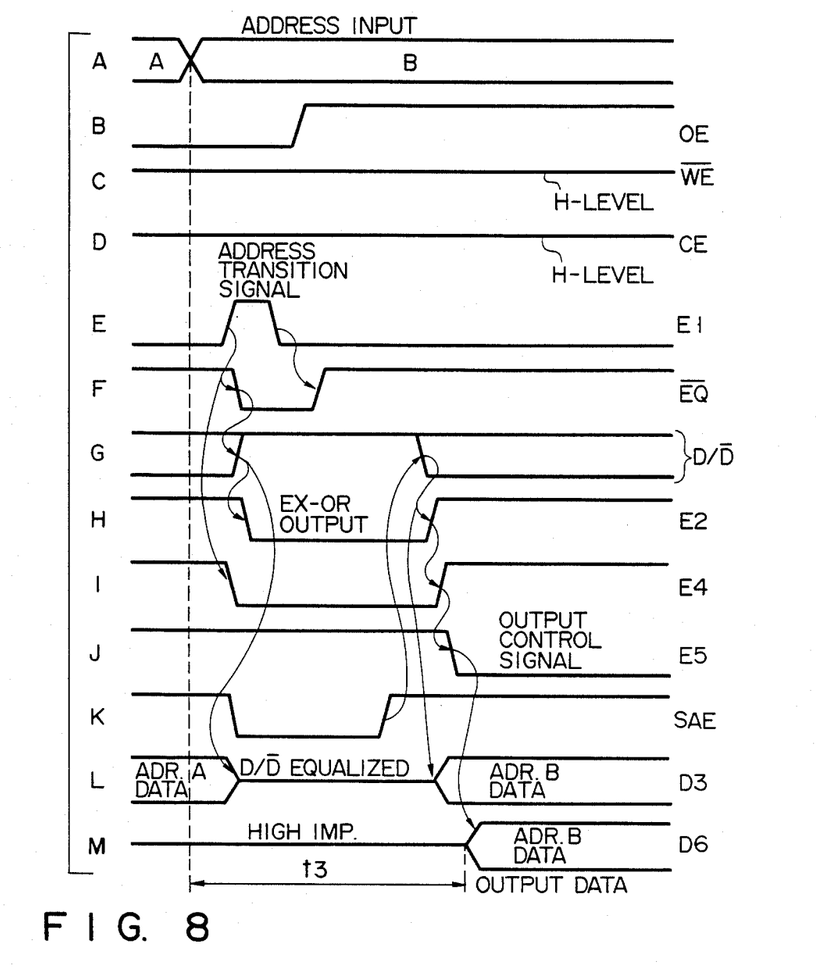
FIGS. 8A to 8M are timing charts for explaining an operation of the circuit in FIG. 6.
Figure 11:
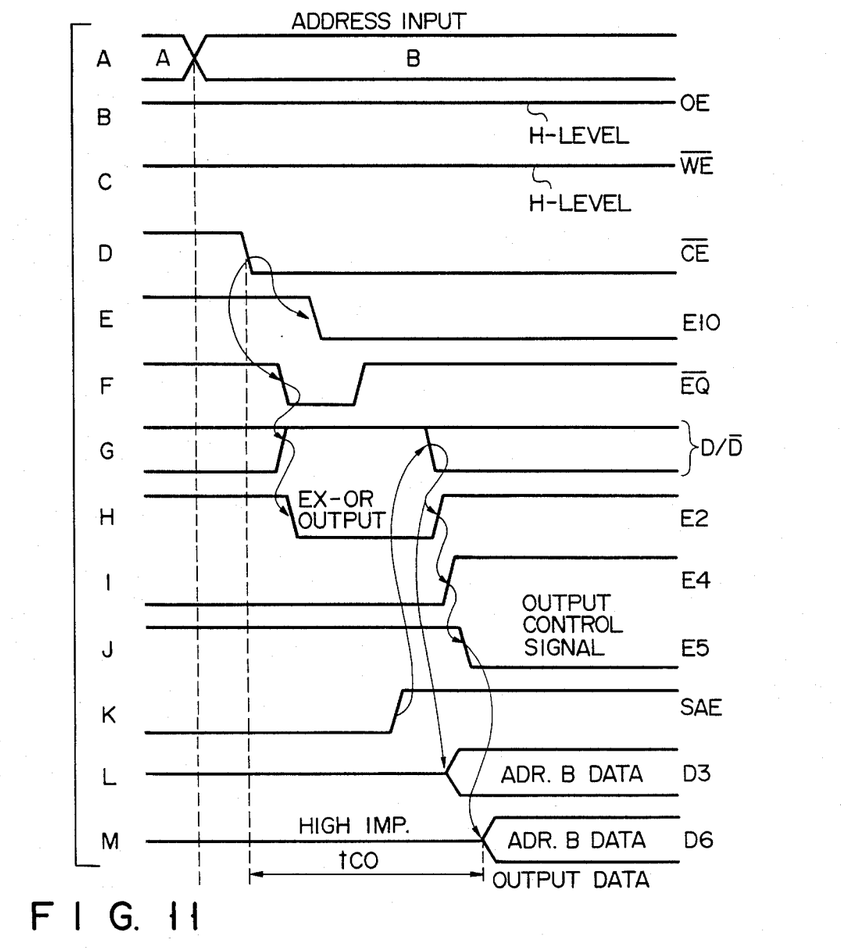
FIGS. 11A to 11M are timing charts for explaining an operation of the circuit in FIG. 10.

The operation of the output buffer control circuit in FIG. 12 upon an address transition is the same as that of the circuit described with reference to FIG. 8. As for the presence/absence of a chip enable signal, the operation in the circuit in FIG. 11 is the same as that of the circuit described with reference to FIG. 11.

In the embodiment in FIG. 12, there is no such problem wherein before current address data (B) is output the preceding address data (A) is instantaneously output in response to both an address transition and a level transition of a chip enable signal (FIGS. 2C and 4C).

Although a conventional 3-state buffer may be used as output buffer 6 shown in FIGS. 6, 10, and 12, an output buffer shown in FIG. 3 on P. 263 of the following reference may be used.

262 1987 IEEE International Solid-State Circuit Conference

ISSCC 87/Feb. 27, 1987

SESSION XIX: HIGH DENSITY SRAMs

FAM 19.7:

A 34 ns 1Mb CMOS SRAM using Triple Poly
    Tomohisa Wada, Toshihiko Hirose, Hirofumi Shinohara, Yugi Kawai, Kojiro Yuzuriha, Yoshio Kohno, Shimpei Kayano,     Mitsubushi LSI Research and development Laboratory Itami, Japan In this case, output control signal E5 in the present invention may be used as output enable signal OE in this reference.

What is claimed is:

1. An output buffer control circuit of a semiconductor memory, comprising:
   a switch circuit whose output state is controlled by a detection output from an address transition detector for detecting an address transition, and by a detection output from a read detector for detecting a completion point of data readout from a memory cell; and
   an output buffer for outputting readout data from the memory cell, an active/inactive state of said output buffer being controlled by use of the output from said switch circuit.

2. A circuit according to claim 1, wherein said switch circuit includes an RS flip-flop which is set when the detection output from said address transition detector becomes active, and is reset when the detection output from said read detector becomes active.

3. A circuit according to claim 2, wherein said output buffer is controlled to be set in an inactive state when said RS flip-flop is set by an output control circuit for performing logical processing for.an output from said RS flip-flop, an output enable signal, a write enable signal, and a chip enable signal, and is controlled to be set in an active state when the output enable signal, the write enable signal, and the chip enable signal are set at a predetermined signal level while said RS flip-flop is in a reset state.

4. A circuit according to claim 3, wherein said read detector includes a pair of sense amplifiers for detecting and amplifying a potential difference between a bit line pair of a memory cell array, a sense equalizing transistor connected between a pair of sense lines respectively connected to output terminals of opposite phases of said pair of sense amplifiers, and an EXOR circuit, having input terminals connected to said pair of sense lines, for outputting the detection output.

5. A circuit according to claim 2, wherein said read detector includes a pair of sense amplifiers for detecting and amplifying a potential difference between a bit line pair of a memory cell array, a sense equalizing transistor connected between a pair of sense lines respectively connected to output terminals of opposite phases of said pair of sense amplifiers, and an EXOR circuit, having input terminals connected to said pair of sense lines, for outputting the detection output.

6. A circuit according to claim 1, wherein said read detector includes a pair of sense amplifiers for detecting and amplifying a potential difference between a bit line pair of a memory cell array, a sense equalizing transistor connected between a pair of sense lines respectively connected to output terminals of opposite phases of said pair of sense amplifiers, and an EXOR circuit, having input terminals connected to said pair of sense lines, for outputting the detection output.

7. An output buffer control circuit of a semiconductor memory, comprising:
   a switch circuit whose output state is controlled by a chip enable signal for controlling an active/ inactive state of said memory, and by a detection output from a read detector for detecting a completion point of data read out from a memory cell; and
   an output buffer for outputting readout data from the memory cell, an active/inactive state of said output buffer being controlled by use of the output from said switch circuit.

8. A circuit according to claim 7, wherein said switch circuit includes an RS flip-flp which is set when the chip enable signal is set in an inactive state, and is reset by the detection output from said read detector.

9. A circuit according to claim 8, wherein said output buffer is controlled to be set in an inactive state when said RS flip-flop is set by an output control circuit for performing logical processing in relation to an output from said RS flip-flop, an output enable signal, and a write enable signal, and is controlled to be set in an active state when the output enable signal and the write enable signal are set at a predetermined signal level while said RS flip-flop is in a reset state.

10. A circuit according to claim 9, wherein said read detector includes a pair of sense amplifiers for detecting and amplifying a potential difference between a bit line pair of a memory cell array, a sense equalizing transistor connected between a pair of sense lines respectively connected to output terminals of opposite phases of said pair of sense amplifiers, and an EXOR circuit, having input terminals connected to said pair of sense lines, for outputting the detection output.

11. A circuit according to claim 8, wherein said read detector includes a pair of sense amplifiers for detecting and amplifying a potential difference between a bit line pair of a memory cell array, a sense equalizing transistor connected between a pair of sense lines respectively connected to output terminals of opposite phases of said pair of sense amplifiers, and an EXOR circuit, having input terminals connected to said pair of sense lines, for outputting the detection output.

12. A circuit according to claim 7, wherein said read detector includes a pair of sense amplifiers for detecting and amplifying a potential difference between a bit line pair of a memory cell array, a sense equalizing transistor connected between a pair of sense lines respectively connected to output terminals of opposite phases of said pair of sense amplifiers, and an EXOR circuit, having input terminals connected to said pair of sense lines, for outputting the detection output.

13. An output buffer control circuit of a memory device, comprising:
   output buffer means, responsive to an output control signal, which is inactivated and does not output data when the output control signal is set at a first logical level, and is activated and outputs readout data from a memory section when the output control signal is set at a second logical level;
   address transition detecting means for detecting that an address input to said memory section transits, and outputting an address transition signal;
   read detecting means for detecting a point at which data is read out from said memory section and outputting a data read signal; and
   output buffer control means, coupled to said output buffer means, said address transition detecting means, and said read detecting means, for supplying the output control signal to said output buffer means and causing said output buffer means to be active when the data read signal is set at a signal level for reading out data after the address transition signal is output.

14. An output buffer control circuit of a memory device, comprising:
   output buffer means, responsive to an output control signal, which is inactivated and does not output data when the output control signal is set at a first logical level, and is activated and outputs readout data from a memory section when the output control signal is set at a second logical level;
   read detecting means for detecting a point at which data is read out from said memory section and outputting a data read signal; and
   output buffer control means, coupled to said output buffer means and said read detecting means, for supplying the output control signal to said output buffer means and causing said output buffer means to be active when the data read signal is set at a signal level for reading out data after a chip enable signal for controlling an enable/disable state of said memory device is set at a chip enable level.

15. An output buffer control circuit of a memory device, comprising:
   output buffer means, responsive to an output control signal, which is inactivated and does not output data when the output control signal is set at a first logical level, and is activated and outputs readout data from a memory section when the output control signal is set at a second logical level;
   address transition detecting means for detecting that an address input to said memory section transits, and outputting an address transition signal;
   read detecting means for detecting a point at which data is read out from said memory section and outputting a data read signal; and
   output buffer control means, coupled to said output buffer means, said address transition detecting means, and said read detecting means, for supplying the output control signal to said output buffer means and causing said output buffer means to be active when the data read signal is set at a signal level for reading out data either after a chip enable signal for controlling an enable/disable state of said memory device is set at a chip enable level or after the address transition signal is output.

16. A circuit according to claim 13, wherein said output buffer means includes:
   a 3-state buffer whose output state is changed by the output control signal and which does not output data when the output state is set in a high impedance state and is controlled to be set in a low impedance state by the output control signal when readout data is output from said memory section.

17. A circuit according claim 14, wherein said output buffer means includes:
    a 3-state buffer whose output state is changed by the output control signal and which does not output data when the output state is set in a high impedance state and is controlled to be set in a low impedance state by the output control signal when readout data is output from said memory section.

18. A circuit according claim 15, wherein said output buffer means includes:
    a 3-state buffer whose output state is changed by the output control signal and which does not output data when the output state is set in a high impedance state and is controlled to be set in a low impedance state by the output control signal when readout data is output from said memory section.

* * * * *